US005377897A

United States Patent [19]

Zimmer

[11] Patent Number: 5,377,897

[45] Date of Patent: Jan. 3, 1995

[54] COMPENSATION OF NON-PARALLELISM (BALANCING) OF A FIRST BODY TO A SECOND BODY

[76] Inventor: Gero Zimmer, 655 Deep Valley Dr., Suite 125, Palos-Verdes, Calif. 90274

[21] Appl. No.: 99,225

[22] Filed: Jul. 29, 1993

[51] Int. Cl.$^6$ .................. H05K 3/32

[52] U.S. Cl. .................. 228/106; 228/212; 228/44.7

[58] Field of Search .......... 228/180.1, 180.21, 180.22, 228/212, 6.2, 44.7, 49.5, 106, 5.5

[56] References Cited

U.S. PATENT DOCUMENTS 4,875,614 10/1989 Cipolla et al. .................. 228/44.7
5,127,573 7/1992 Chang et al. .................. 228/180.1
5,150,827 9/1992 Fries .................. 228/180.1

*Primary Examiner*—Samuel M. Heinrich

*Attorney, Agent, or Firm*—Notaro & Michalos

[57] ABSTRACT

A process for establishing and maintaining parallelism and balance forces between the surfaces of two bodies, in particular, surfaces to be snuggled against each other for the transfer of thermal energy, includes holding springs for laterally holding one of the bodies against movement transverse to a force direction. Resilient mounting bearings are also provided for resiliently holding the body substantially parallel to the force direction but with all points of rotation for the body being spaced away from the body and preferably laterally of the body. Forces apply between the bodies to establish parallelism. The resilient mounting is adjusted during this static mode to maintain the parallelism for subsequent dynamic modes of operation. During the dynamic modes of operation, the resiliency of the holding and mounting arrangements maintain parallelism and balanced forces even in the dynamic mode.

9 Claims, 5 Drawing Sheets

420a
418a
416a
417a
412a
415a
411a
401a
401b
416b
421a
401
422a
409
410a
403
410b 411b
402
422a
422b
403b
409a 403C
413

COMPENSATION OF NON-PARALLELISM (BALANCING) OF A FIRST BODY TO A SECOND BODY

FIELD AND BACKGROUND OF THE INVENTION

The present invention in general involves a technique for balancing two bodies with respect to each other, and particular to a new and useful arrangement and technique for balancing parts which are particularly used for transferring thermal energy by means of forced controlled thermal contact.

Several procedures and apparatuses are known and used already to perform balanced compensation, but basically do not avoid side displacements and have limitations particularly in the dynamic mode during treatments.

A typical example is to allow rotation of at least one body about a fixed center while force is applied. Any such point of rotation, however, creates side-displacement and limits dynamic compensation. The mechanical projection of non-parallel bodies to each other is always shorter than their actual dimensions and therefore requires side displacements during compensation. Using a fixed rotation point at any location requires that one edge of a body forces the opposite edge of this body to move and displace as well. Locating the point of rotation to different points does have effects on such displacements—but cannot prevent it. This is in particular the case if larger compensations are required.

SUMMARY OF THE INVENTION

This invention refers to a process and apparatus to apply force from a first body to at least a second body so that force is equally distributed. A typical application is to transfer thermal energy from a first body to a second body by means of thermal contact using equally balanced and distributed force within the defined contact/force area or to radiate thermal energy from one body to another body using an equally defined gap created by force controlled spacers. Transferred thermal energy can be equally distributed only by means of equally distributed force and balance. Balancing these bodies, to each other prevents any gap between the bodies even if their surfaces are not parallel to each other initially.

Another feature of this invention is to keep side-displacement of the bodies to each other during balancing to a minimum or to eliminate it together. A part or component placed between the bodies should keep its defined position and should not move in uncontrolled directions. Basically, a balancing process applies some unwanted force in other directions as well which may cause displacement force to the bodies and parts.

In this invention force is handled using mechanically floating bearings operating in the force direction only and operating without a specific point of rotation and creating no or only little side-displacement. Using pre-adjustment of the invention for prebalancing reduces such displacements further.

This invention applies such balanced force in a static mode while force is applied first, and in a dynamic mode, while parts and/or bodies may expand in some areas due to thermal expansions and other reasons.

Applying mechanical force and/or thermal energy from a first body to a second body in one or more dimensions is limited by missing conformance of the bodies to each other. Additional tolerances are created by the displacement of at least one body to create force due to tolerances in mechanical bearings and fixtures. Further, parts positioned between the bodies such as a printed wiring board are usually not specified having parallel surfaces. If thermal energy is applied additionally, mechanical expansion may be created depending on the thermal properties of all items. If a part between two bodies should be heated such as by means of thermal contact, thermal energy has to be transmitted uniformly and without being affected by any mechanical static or dynamic changes. Further; any side-displacement or side-force not conforming with the force direction during mechanical and thermal treatment, needs to be avoided.

This is the case if a high pin count device with 4-sided leads must be mounted to a printed wiring board using soldering technology, where the required thermal energy is applied by a soldering tool, and transferred to the leads by means of force controlled thermal contact applied to all leads of the part simultaneously. If these requirements are not met, thermal energy is not transferred uniformly to all the leads, causing soldering errors. This uniform application is required in the static mode prior to starting the thermal treatment and in particular in the dynamic mode during the thermal treatment, which causes various mechanical expansions in different areas and therefore additionally reduces surface conformation.

If automatic and self-balancing static and dynamic conformation of the bodies and parts is available in an apparatus, a side-displacement during balancing may be created. The projection of a non-parallel surface is always shorter than its real surface dimension. Therefore, any balancing creates a side-force resulting in a side-displacement and shifting of parts. This is an unwanted feature for many applications and would therefore limit or reduce the application of automatic balancing.

In this invention, balancing is performed with one or more bodies using a mechanically floating displacement device, preferably with friction-free bearings operating in a force direction only, without having a fixed point of rotation and performing static as well as dynamic balancing.

In this invention, balancing may be done basically in two steps to reduce or eliminate unwanted side-displacements as much as possible. Step 1 takes care of non-parallelism in the static mode prior to or while force is applied. This can be done by measurement and pre-balancing using a required correction for a moving and/or fixed device position. A typical operating procedure is to apply force under real conditions, with or without parts attached, and to store the performed static correction for the next cycle. This leaves step 2 to balance dynamic changes of non-parallelism such as those crated by changes in the treated parts caused by applied force and by thermal expansion, resulting in a minimum of side-displacement. Aligning the overall mechanical system performance is therefore included in step 1 and does not affect the dynamic correction. If step 2 requires much correction as well, even this step can be simulated and the data used for automatic pre-balancing, resulting in additional reduction to side-displacement.

Because of the mechanically floating bearings used in this invention, applied force is equally distributable during static and dynamic balancing. Using the prealignment procedures eliminates side-displacements in the overall mechanical system and leaves only corrections to be made which are caused by dynamic changes during treatments. Since no fixed point of rotation is used, balancing at one particular point or area does not affect other areas.

A basic application of this invention is to transfer energy from one or more bodies to one or more parts by means of applied force or radiation, such as used to solder-mount high pin count and fine pitch devices to substrates using thermal treatment.

Using pulsed hotbar soldering technology, extremely fine pitch devices can be placed and soldered to substrates by means of force controlled thermal energy transferred from a thermal source to the thermal loads, using liquifying materials (solders) and the required thermal process. Such devices require precise alignment of leads to pads and avoidance of any side force during the soldering process which would create misalignment. The substrate can be a multilayer board with tolerances in its thickness, its parallelism as well as entire different thermal properties along the thermally treated areas, resulting in different dynamic thermal expansions as well as deformation.

This invention takes care of such applications and allows for compensation of static as well as dynamic tolerances and changes before and during the process resulting in extremely uniform transformation of thermal energy and close to zero defects in the final parts.

The basic requirement of this invention is to perform equally balanced force between bodies and to prevent side-displacement while such force and balancing is applied. Further, such compensation should be done in a static mode while such force is applied as well as in a dynamic mode while force is applied already and the parameters of the device(s) are changed, such as by thermally created mechanical expansion and force sensitive means.

DESCRIPTION OF THE PREFERRED EMBODIMENTS

Figure 5A:
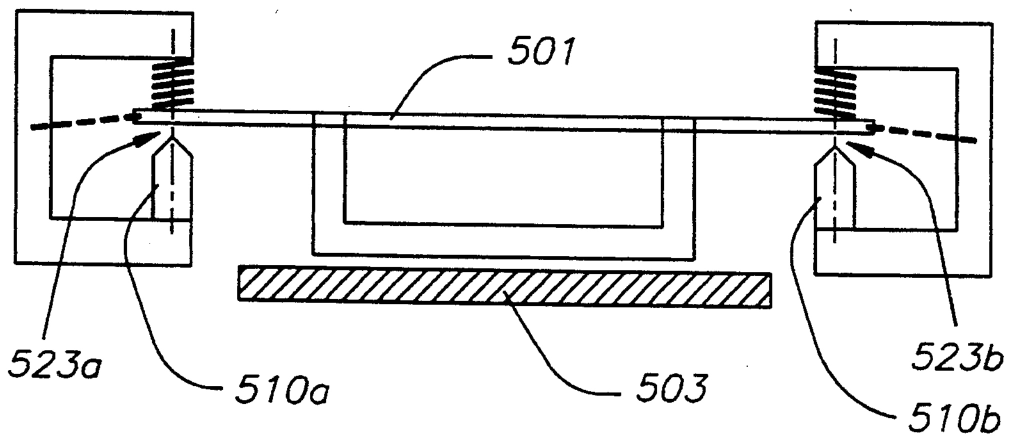
FIG. 5*a* and 5*b* illustrate a further embodiment of the invention.
Figure 5B:
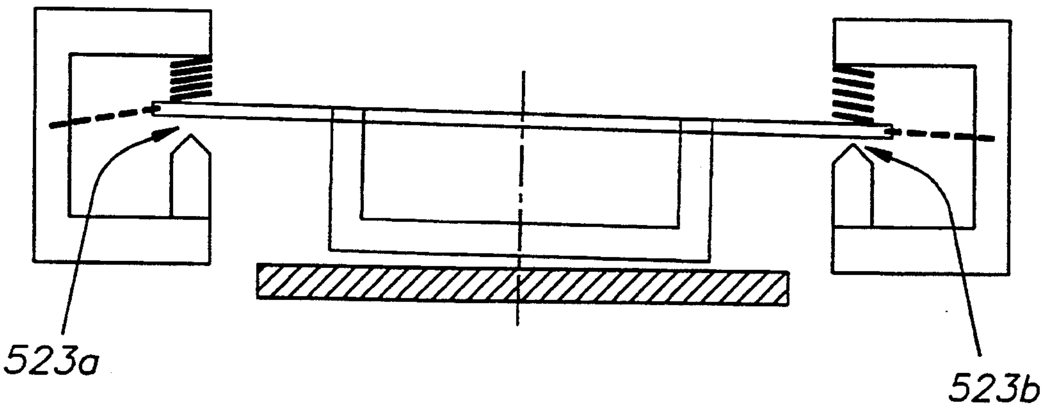

To perform the required conformation of two or more bodies to each other, mechanically floating bearings are used to allow snuggling of the bodies to each other while simultaneously reducing side-displacements (FIG. 5*a* and 5*b*). Using such bearings eliminates any fixed point of rotation and thus, the side-displacements they cause (FIG. 3*a* and 3*b*) while performing, in a wide dynamic range (FIG. 3*a*, 3*b*, 5*a* and 5*b*), the needed compensation.

Figure 4A:
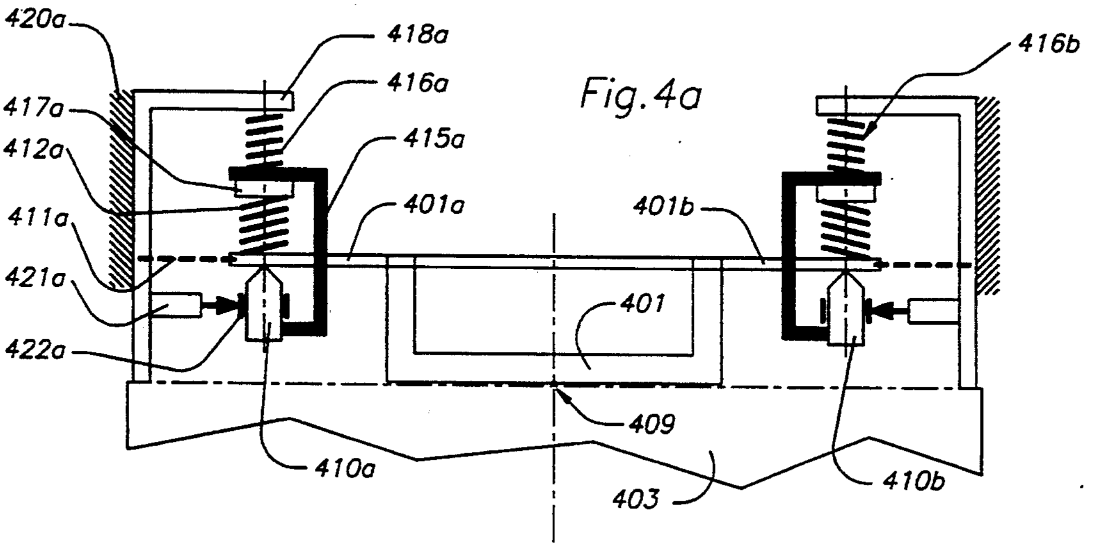
FIG. 4*a* illustrates a second embodiment of the invention.
Figure 4B:
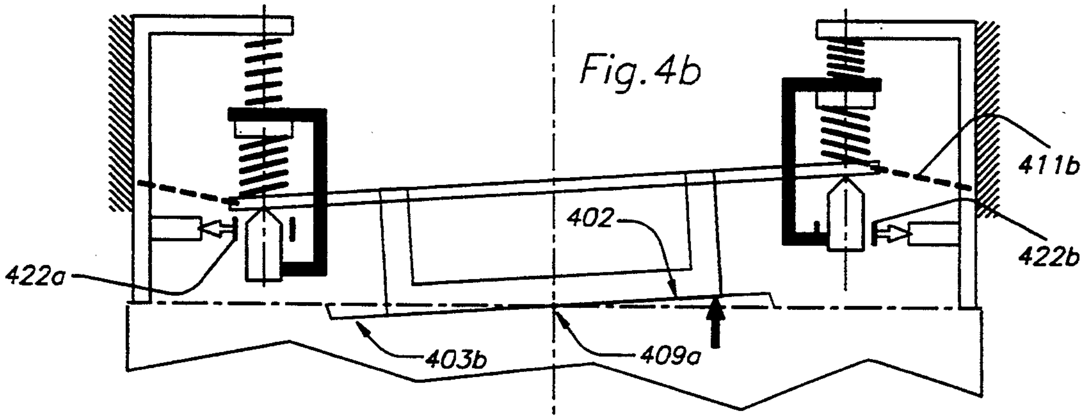
FIG. 4*b* and 4*c* illustrate a further embodiment of the invention.
Figure 4C:
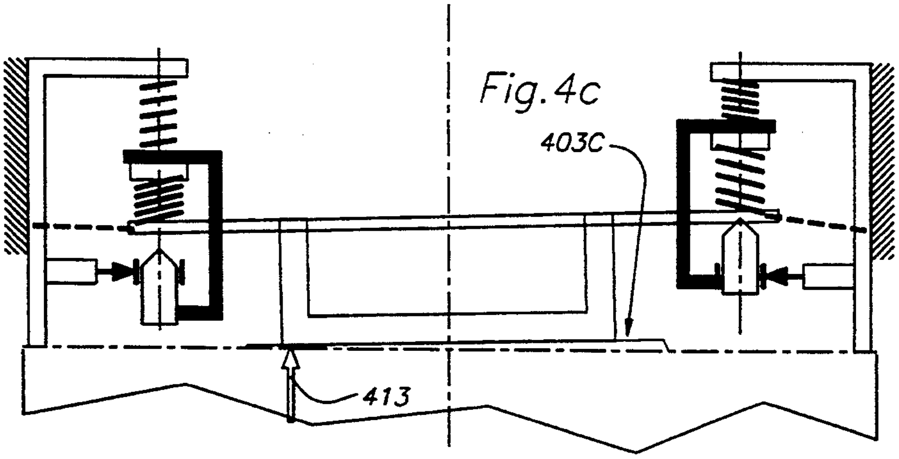

Further reducing the basic side-displacement and therefore applied side-force created during snuggling, this invention uses an additional pre-balancing procedure. This is done either by measuring the conformation of the bodies to each other or by reading and maintaining the performed compensation of real conditions in a pre-alignment cycle (FIG. 4*a*, 4*b* and 4*c*). Such pre-alignment cycle may include the parts to be treated with a thermal cycle as well, such as the parts to be soldered.

This fulfilled basic compensation (step 1) may be used for subsequent cycles and such procedure may be repeated again and may include simulated as well real analyzed data for the next real cycle. Additional sensing devices may be included, such as to read force and displacement. Even dynamic data (step 2) may be included. This allows presetting the device for lowest side displacement using static data taken prior to an operating cycle, adding data taken from a simulated cycle as well as a real-cycle and dynamic data available from former operating cycles.

To preset the subsequent basic value for compensation for following cycles, mechanical set-screws in the simplest form may be used. Preferably, however, software supported mechanical setting devices are utilized.

Another important feature of the invented device is its capability for dynamic compensation (step 2) with no compromise. This allows snuggling caused by applied and changed forces, and thermally caused mechanical expansions and twisting. Since the same system and operation of bearings is responsible, dynamic snuggling will not be different and will create a minimum side displacement, if any. This is supported by the relatively long operating range of the mechanically floating bearings which do not make any difference between static and dynamic snuggling.

This invention is explained in the drawings showing typical applications which may supply thermal energy from one area of a body to another area of another body, by means of force controlled thermal contact.

Figure 1:
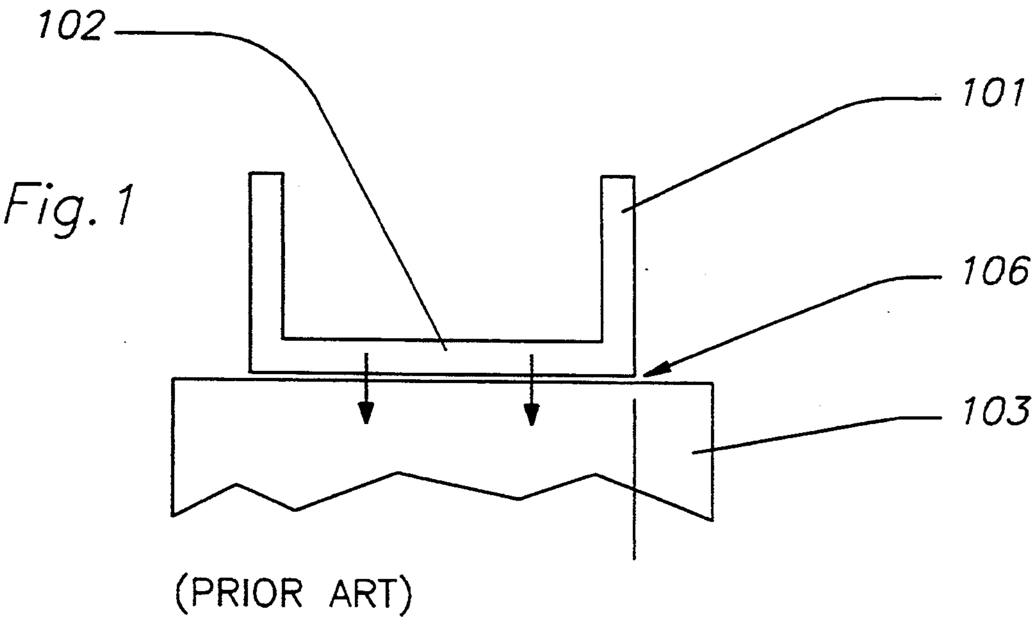
FIG. 1 illustrates an ideal relationship between two bodies which are perfectly parallel to each other without the benefit of any compensation system, and representing an ideal prior art system.

The basic system with entirely conforming surfaces is shown in FIG. 1, where 101 represents one body, such as a heated bar with legs, which transfers its thermal energy from its surface 102 by means of thermal contact or thermal radiation, to the other body 103. Uniform thermal contact is required within the entire dimension of the contact area between 102 and 103. This can only be achieved if body 103 is entirely parallel to surface 102. Any non-conforming gap 106 caused by the two bodies not being parallel, will result in non-uniform thermal energy transfer. Transferred thermal energy heats the body 103 and cools the body 102, which causes mechanical expansion (positive or negative) and creates additional dynamic changes in flatness and dimensions. Such a configuration using stiff bodies and stiff bearings has limitations in its ability to uniformly transfer thermal energy by controlled force. It requires a different method for improvement, which is provided by this invention.

Figure 2:
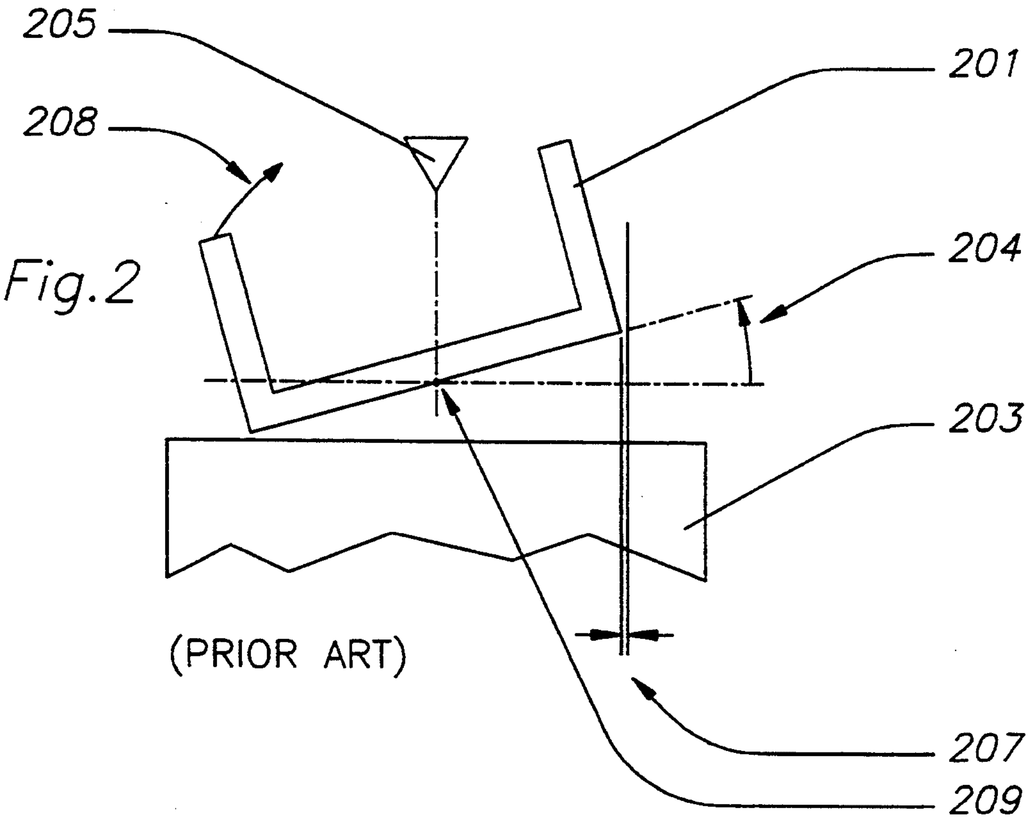
FIG. 2 shows an unbalanced system of the prior art which allows one body to rotate with respect to another body.

FIG. 2 shows a well-known basic concept for compensation. Body 201 may rotate using a real or virtual point of rotation 209, if force 205 is applied by the body 201 to body 203. Performed rotation 204 naturally creates a side force 208 and side-displacement 207 compared to body 203, since the projected length of 201 onto 203 is always shorter compared to a conforming alignment. Further, this configuration does not allow compensation for dynamic changes such as those created by thermal treatments.

An additional disadvantage of this configuration is the missing pre-alignment capability of body 201 compared to body 203, which may create additional shifting 207 and could add more non-uniform force to this system.

Further, setting the shown point of rotation 209 at the center of the surface of body 201, may not be easy to realize. Usually, 209 is located more inside body 201, resulting in even more side-displacement.

Figure 3A:
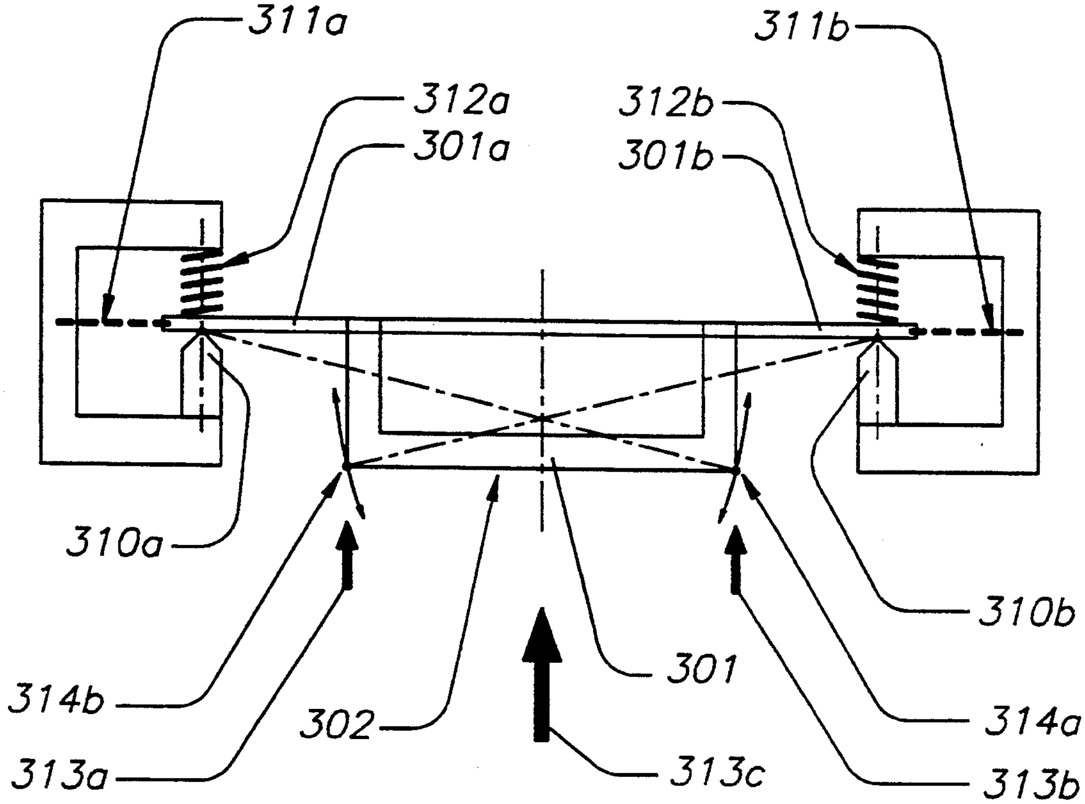
FIG. 3*a* is a configuration conforming to the present invention.
Figure 3B:
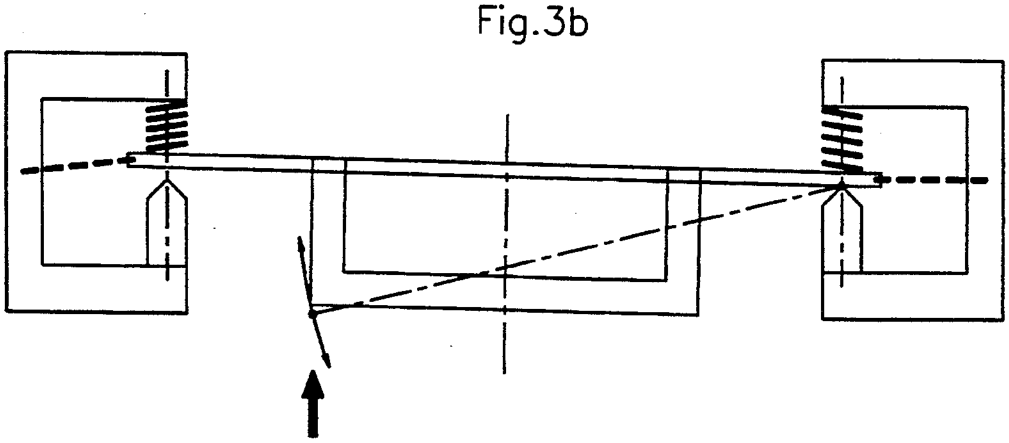
FIG. 3*b* is a view similar to FIG. 3*a* showing the dynamics of the invention.

FIG. 3*a* and 3*b* show the basic invented configuration. The supports, points or centers of rotation 310*a* and 310*b*, are moved as far as possible laterally out of the center of the body 301, and two rather than one point are used, which may even operate simultaneously and change with dimensions of the levers thus created, which depend on the distribution of the applied force and are created automatically. Such points of rotation may be placed in any real or virtual area and is not limited to the shown example. If forces 313*a* or 313*b* are applied, body 301 and its surface 302 may rotate about 310*a* or 310*b* using lever arms 301*a* or 301*b* respectively, in the directions 314*a* and 314*b*.

Body 301 is connected by lever arms 301*a* and 301*b* of the invention, on bearings 310*a* and 310*b* and is kept in its basic position by flexible members 311*a* and 311*b*. These bearings may be folded leaf-springs or air-bearings or magnetically preloaded bearings, and allow body 301 to move only in the direction of the applied force 313*c*. The basic static position of body 301 is defined by the supports 310*a* and 310*b* which may have alignment capability for basic settings. These positions are supported by applied forces, e.g. spring forces 312*a* and 312*b* respectively.

Applied force 313*a* to body 301, such as from a non-conforming second body, results in rotating of 302 about the rotation point 310*b* and radius 314b, lifting arm 301*a* off from 310*a* (FIG. 3*b*). Such movement definitely creates side-displacement of 301 but is a fraction of the displacement shown in FIG. 2 because of the much longer and easier to design lever 301*b*.

As a basic invention, supports 310*a* and 310*b* may be adjustable (e.g. mechanically) to preset a basic conformation with another body. Using the preloaded forces 312*a* and 312*b* defines its position in the force direction 313*c*. Forces 313*a*, 313*b* and 313*c* and the force of members 311*a* and 311*b* may be matched for lowest side-displacement.

Another invented feature in accordance to FIG. 3*a* and 3*b* is the ability for dynamic balancing of body 301 in the force direction 313*c* within a wide operating range. FIG. 5*a* and 5*b* help explain these advantages.

Body 301 in FIG. 3*a* or 501 in FIG. 5*a* respectively may move freely in the force direction without touching any support (310*a* or 310*b*) and applies snuggling force to another body 503 shown in FIG. 5*a*. The re-alignment does not affect such dynamic movement if the supports are left behind. It is only important to create spaces 523*a* and 523*b* allowing free movement of body 501 in the force direction. FIG. 5*b* shows a case where gap 523*a* is larger than gasp 523*b*, due to uneven force.

For applications requiring close to zero side-displacement, the advanced invention is explained in FIG. 4*a*, 4*b* and 4*c*. FIG. 4*a* shows the basic configuration without any force applied to body 401. 412a represents the force spring which allows lever 401*a* to attach the support 410*a* held together by frame 415*a*. 417*a* is an invented additional force transducer which may read and/or set force 412*a*. 411*a* is the bearing to keep the system movable in the force-direction only.

In FIG. 4*a*, frame 415*a* and bearing 410*a* are connected to a slide or journal 422*a* and a blocking device 421*a* is held by a frame 418*a*, which also mounts the body 403 to a solid mounting 420*a*. 409 is a possible simulated point of rotation only to explain this operation, but may be in any location.

FIG. 4*b* shows a typical configuration to perform basic alignment between surface 402 or of body 401 and a body 403*b*, using force 416*a* and 416*b* in FIG. 4*a* and using the simulated point of rotation 409*a*.

Open the slides 422*a* and 422*b* by releasing the devices 421*a* and 421*b*. This allows forces 416*a* and 416*b* applied to body 401 and 403*b* through levers 401*a* and 401*b* to rotate. This results in snuggling both bodies while the non-force direction will still be maintained with bearings 411*a* and 411*b*. After performing such prealignment, 421*a* and 421*b* will be activated to clamp supports 410*a* and 410b in place. FIG. 4*c* shows the performed dynamic snuggling while forces 412*a* and 412*b* are applied and distributed by body 401 to 403*c*. Forces 416*a* and 416*b* are not active anymore for any movement in the force-direction. Similar to FIG. 5*a* and 5*b*, body 401 may be lifted-up from supports 410*a* and 410*b* to allow free additional dynamic balancing.

Figure 6:
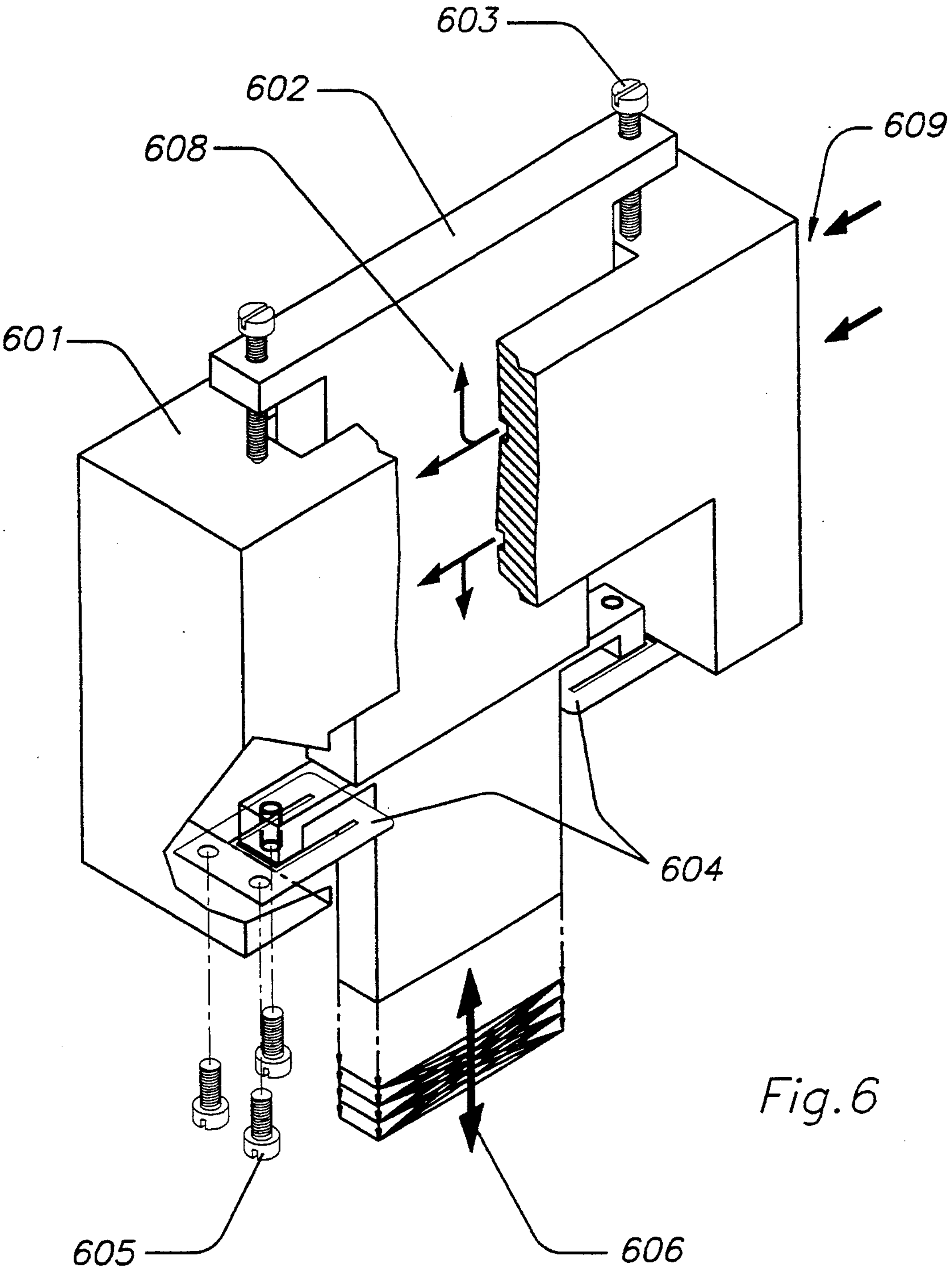
FIG. 6 is a perspective view showing a further and preferred embodiment of the invention.

FIG. 6 shows a typical application of a device which could hold a single heated bar. 601 is an enclosure to hold the entire device together and to keep the moving body 602 air-bearings 608 supplied with air 609 and allowing movement in the force direction 606 only. 604 is a typical design of a leaf-spring allowing body 602 to move in the force direction only. These springs are mounted using screws 605. Compressed air is supplied to the input 608. The required pre-balancing can be made using set-screws 603.

I claim:

1. A process for applying a force between at least two bodies each having surfaces to be snuggled against each other, while maintaining balance and parallelism between the surfaces during static and dynamic modes of operation, comprising:

resiliently holding at least one of the bodies substantially against movement in a transverse direction, transverse to a nominal force direction used for snuggling the surfaces toward each other, using at least one mechanically resilient member;

resiliently mounting at least one of the bodies for rotation about no fixed point of rotation for balancing parallelism between the surfaces, all points of rotation for said rotation being spaced laterally away from the surfaces;

applying a static force to at least one of the bodies for snuggling the surfaces toward each other during a static mode of operation for establishing parallelism between the surfaces;

while applying the static force to establish the parallelism between the surfaces, adjusting the resilient mounting for pre-balancing the bodies with respect to each other to maintain the parallelism; and applying dynamic snuggling force between the bodies to snuggle the surfaces against each other during a dynamic mode of operation while maintaining parallelism and balancing through resiliency of the resilient holding and adjusted resilient mounting.

2. A process according to claim 1, including measuring an amount of adjustment required to the resilient mounting for establishing parallelism between the surfaces during application of the static force during the static mode, and adjusting the resilient mounting to maintain parallelism between the surfaces, based on the measurement.

3. A process according to claim 1, including resiliently mounting the at least one body using one of spring force, magnetic field force and air pressure force.

4. A processing according to claim 3 including resiliently holding the at least one body using at least one leaf spring.

5. A process according to claim 1, wherein the at least one body is mounted on a lever arm, providing at least two spaced apart bearings engageable against the lever arm on opposite sides of the at least one body, and moving at least one of the bearings in a direction parallel to the direction of applied force for snuggling the surfaces, to adjust the resilient mounting for maintaining parallelism during the step of applying force during a static mode, and thereafter fixing the bearing to maintain the parallelism.

6. A process according to claim 6, including applying a counter force against the lever arm in a direction opposite to a direction at which the lever arm engages against the bearing, for dynamically balancing the at least one body during the applying of force during the dynamic mode.

7. A process according to claim 6, including allowing the at least one body to rotate about two spaced apart centers of rotation adjacent respective ones of the bearings.

8. A process according to claim 1, including adjusting the resilient mounting during application of force during the dynamic mode, to dynamically maintain parallelism between the surfaces and balancing between the bodies during the dynamic mode.

9. A process according to claim 8, including recording displacement of at least one of the bodies during the dynamic mode for use in balancing the bodies and maintaining parallelism during subsequent dynamic modes.

* * * * *